US012622241B2

(12) United States Patent
Huang et al.

(10) Patent No.: US 12,622,241 B2
(45) Date of Patent: May 5, 2026

(54) STRUCTURES WITH CONVEX CAVITY BOTTOMS

(71) Applicant: Taiwan Semiconductor Manufacturing Company, Ltd., Hsinchu (TW)

(72) Inventors: Yu-Lien Huang, Hsinchu (TW); Wei Hsiang Chan, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 545 days.

(21) Appl. No.: 18/155,926

(22) Filed: Jan. 18, 2023

(65) Prior Publication Data

US 2024/0096696 A1     Mar. 21, 2024

Related U.S. Application Data

(60) Provisional application No. 63/375,804, filed on Sep. 15, 2022.

(51) Int. Cl.
*H01L 21/768* (2006.01)
*H01L 23/522* (2006.01)

(52) U.S. Cl.
CPC .. *H01L 21/76843* (2013.01); *H01L 21/76807* (2013.01); *H01L 21/7684* (2013.01); *H01L 21/76877* (2013.01); *H01L 23/5226* (2013.01)

(58) Field of Classification Search
CPC ......... H01L 21/76843; H01L 21/76807; H01L 21/7684; H01L 21/76877; H01L 21/76808; H01L 23/5226; H01L 23/5283; H01L 23/53238; H01L 23/53295
See application file for complete search history.

(56) References Cited

U.S. PATENT DOCUMENTS

| | | | |
|---|---|---|---|
| 8,236,645 B1 * | 8/2012 | Chumakov | ......... H01L 23/5223 |
| | | | 438/255 |
| 2003/0001240 A1 * | 1/2003 | Whitehair | ........... H01L 23/5329 |
| | | | 257/774 |
| 2005/0142841 A1 * | 6/2005 | Lee | .................... H01L 21/76804 |
| | | | 257/E21.582 |
| 2014/0300005 A1 | 10/2014 | Di Franco et al. | |
| 2017/0110398 A1 * | 4/2017 | Chang | ................. H01L 23/5226 |
| 2017/0229341 A1 * | 8/2017 | Chang | ................... H01L 23/528 |
| 2018/0012797 A1 * | 1/2018 | Liu | ................... H01L 21/76873 |
| 2019/0109004 A1 | 4/2019 | Huang et al. | |

FOREIGN PATENT DOCUMENTS

| | | | | |
|---|---|---|---|---|
| EP | 1225621 A1 * | 7/2002 | ........ | H01L 21/31138 |

* cited by examiner

*Primary Examiner* — Andres Munoz
(74) *Attorney, Agent, or Firm* — Ingrassia Fisher & Lorenz, LLP

(57) ABSTRACT

Provided are conductive structures located within dielectric material, and methods for fabricating such structures and devices. An exemplary method includes providing a substrate having a conductive feature in a first dielectric layer; depositing a second dielectric layer over the conductive feature and the first dielectric layer; etching the second dielectric layer to form a cavity through the second dielectric layer, wherein the cavity has a bottom with a convex profile; depositing a barrier layer along the bottom of the cavity; and depositing a conductive material in the cavity to form a structure electrically connected to the conductive feature.

20 Claims, 14 Drawing Sheets

STRUCTURES WITH CONVEX CAVITY BOTTOMS

CROSS-REFERENCE TO RELATED APPLICATION

This application claims the benefit of U.S. Provisional Application No. 63/375,804, filed Sep. 15, 2022.

BACKGROUND

The scaling down of semiconductor devices has led to challenges that may not have been presented by previous generations at larger geometries.

For example, metal line (e.g., copper) gap fill becomes more challenging at scaled down dimensions due to increased aspect ratios of cavities such as vias and trenches. Further, in dual damascene processing the spacing between vias and trenches is getting smaller. Formation of barrier layers, such as TaN, on trench profiles may be increasingly difficult at scaled down dimensions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
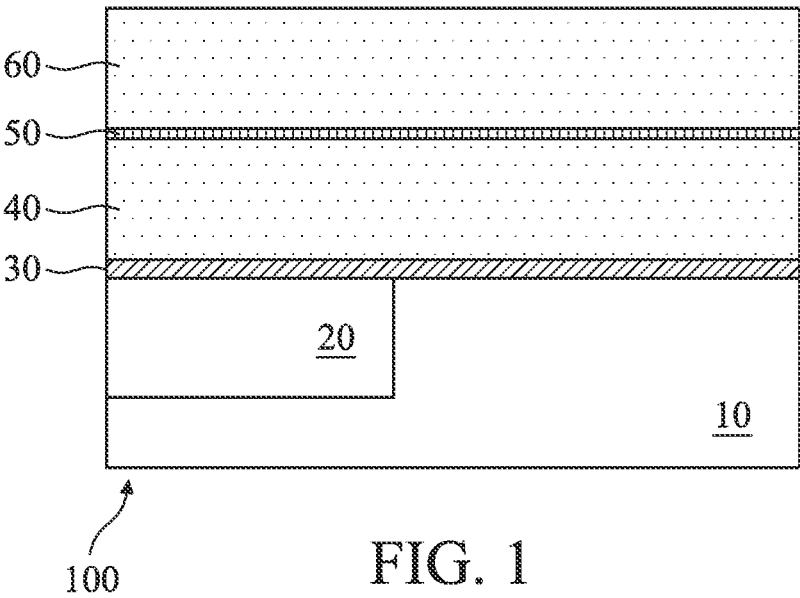
FIGS. 1-10 are cross-sectional schematic views of a portion of a semiconductor structure during sequential stages of a fabrication process for forming a via-trench cavity in accordance with some embodiments.

The following disclosure provides many different embodiments, or examples, for implementing different features. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "over", "overlying", "above", "upper", "top", "under", "underlying", "beneath", "below", "lower", "bottom", "side", and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

When a spatially relative term, such as those listed above, is used to describe a first element with respect to a second element, the first element may be directly on the other element, or intervening elements or layers may be present. When an element or layer is referred to as being "on" another element or layer, it is directly on and in contact with the other element or layer.

In certain embodiments herein, a "material layer" is a layer that includes at least 50 wt. % of the identified material, for example at least 60 wt. % of the identified material, or at least 75 wt. % of the identified material, or at least 90 wt. % of the identified material; and a layer that is a "material" includes at least 50 wt. % of the identified material, for example at least 60 wt. % of the identified material, at least 75 wt. % of the identified material, or at least 90 wt. % of the identified material. For example, certain embodiments, each of a titanium nitride layer and a layer that is titanium nitride is a layer that is at least 50 wt. %, at least 60 wt. %, at least 75 wt. %, titanium nitride, or at least 90 wt. % titanium nitride.

For the sake of brevity, conventional techniques related to conventional semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many conventional processes will only be mentioned briefly herein or will be omitted entirely without providing the well-known process details. As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

Embodiments described herein provide for forming conductive interconnects. In particular, embodiments described herein may provide for a reduction in void formation in conductive interconnect structures such as metal lines, plugs, or conductive vias. For example, embodiments described herein provide for formation of a continuous barrier layer along the sidewalls and bottoms of cavities formed in dielectric material. Continuous barrier layers, i.e., barrier layers without voids or other disconnections, are formed through the formation of cavities with desirable profiles.

Specifically, during an exemplary method, a material is etched to form a cavity. The etch process is designed and controlled to form the cavity over a bottom surface formed by the remaining unetched material, which is provided with a convex profile. In other words, the depth of the etching process is greater at the sidewalls of the cavity and is less at the center region of the cavity. As a result, the bottom surface under the cavity has a greater height at a central region and a lower height at a periphery. Such a cavity profile has been found to facilitate formation of a continuous barrier layer lining the cavity. Additional conductive material may then fill the remaining cavity overlying the barrier layer. A conductive interconnect, such as a metal line, is formed by and includes the barrier layer and the conductive material fill.

While the bottom surface formed by the unetched material under the cavity defines a convex profile, the conductive interconnect formed within the cavity has a concave profile reciprocal to the convex profile of the bottom surface. Specifically, the conductive interconnect has central region at a shallower depth and an outer periphery at a greater depth.

As used herein, a "profile" of the bottom surface under the cavity or of a conductive interconnect formed within the cavity refers to the cross-section taken along a vertical plane perpendicular to the underlying substrate, and is parallel to the plane of the drawing sheets of the Figures herein.

While the etching process and etched structure described herein may be utilized at any desired stage of fabrication, in certain embodiments the process and structure are described in conjunction with back end of line (BEOL) processing. For example, the process and structure may be utilized during a via-first damascene protocol or during a trench-first damascene protocol for fabricating conductive interconnect structures. FIGS. 1-10 illustrate a typical via-first damascene protocol and FIGS. 11-20 illustrate a typical trench-first damascene protocol.

Referring to FIG. 1, an initial stage of processing of a semiconductor structure 100 is shown.

In FIG. 1, a first layer of dielectric material 10 is formed over a substrate (not shown). The first layer 10 may be considered to be an interlayer dielectric (ILD) or an intermetal dielectric (IMD). Further, a conductive contact 20 is formed within the first layer 10. An etch stop layer 30 may be formed over the first layer 10 and conductive contact 20. As shown, a second layer of dielectric material 40, such as an interlayer dielectric (ILD) is formed over the etch stop layer 30. Further, an optional etch stop layer 50 is formed over the second layer 40. As shown, a third layer of dielectric material 60, such as an intermetal dielectric (IMD) is formed over the etch stop layer 50.

Figure 2:
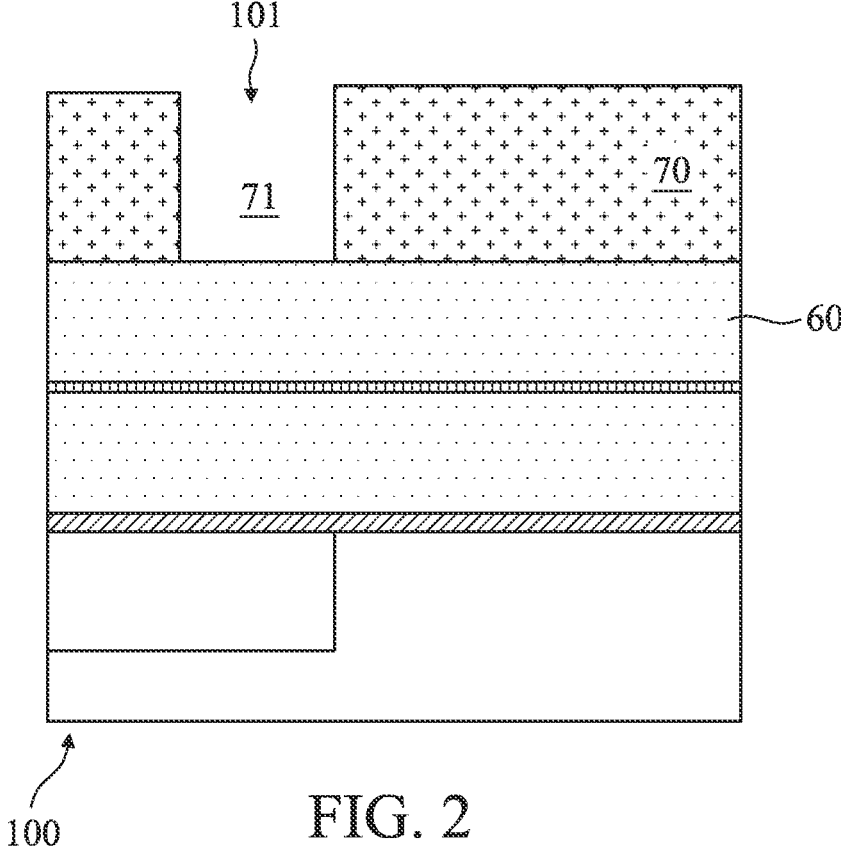

In FIG. 2, a via formation process begins. In FIG. 2, a mask 70, such as photoresist, is formed over the third layer 60 and is patterned to form an opening 71 overlying an uncovered portion 101 of the structure 100.

Figure 3:
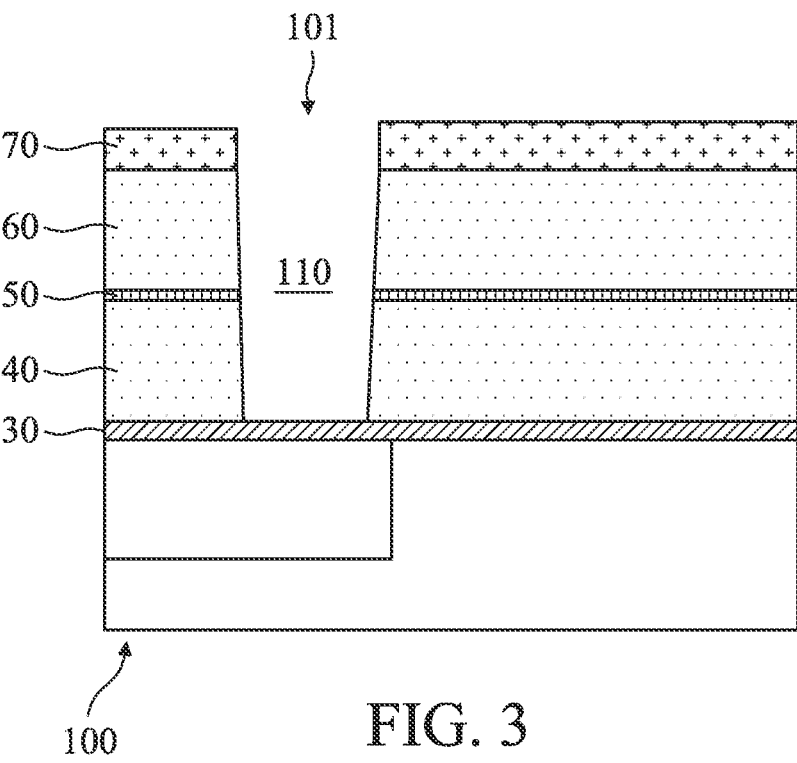

In FIG. 3, an etch process is performed to etch through the uncovered portions 101 of the third layer 60, the etch stop layer 50, and the second layer 40. The etch process may land on the etch stop layer 30. As a result, a via 110 is formed.

Figure 4:
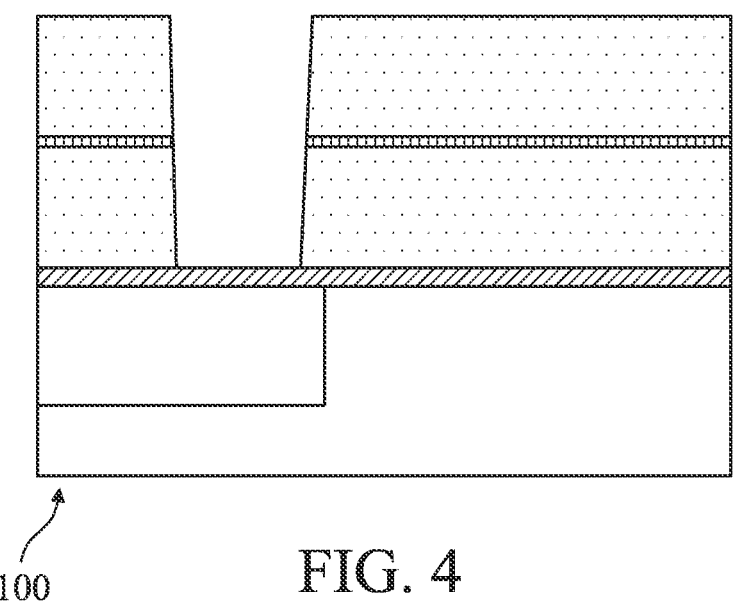

In FIG. 4, remaining portions of the mask 70 are removed.

Figure 5:
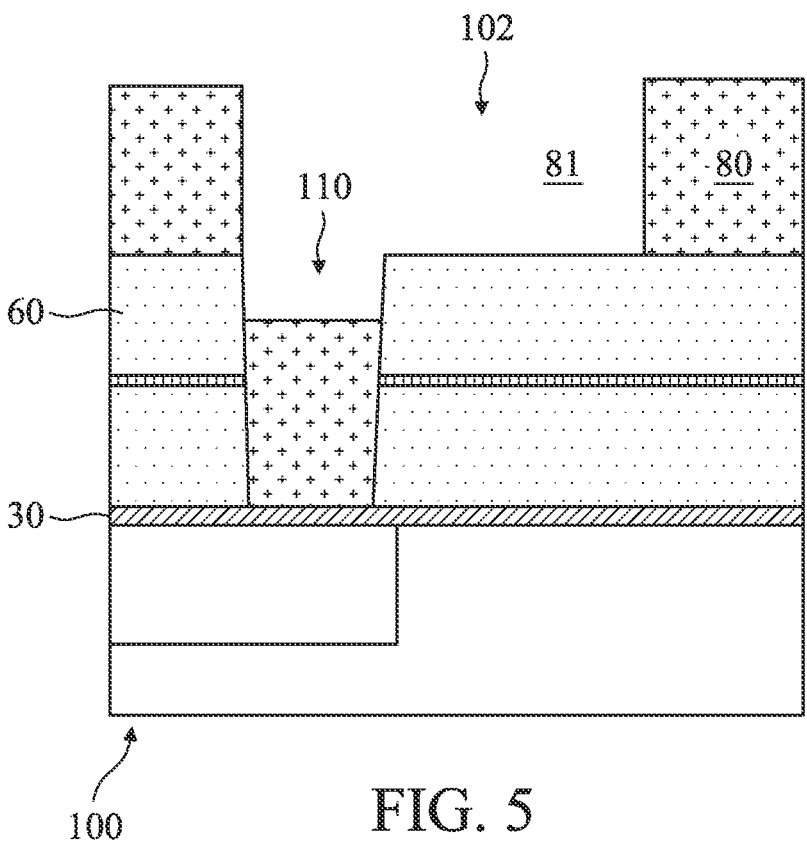

In FIG. 5, a trench formation process begins. In FIG. 5, a mask 80, such as photoresist, is formed over the third layer 60 and over the etch stop layer 30 in the via 110, and is patterned to form an opening 81 overlying an uncovered portion 102 of the structure 100.

Figure 6:
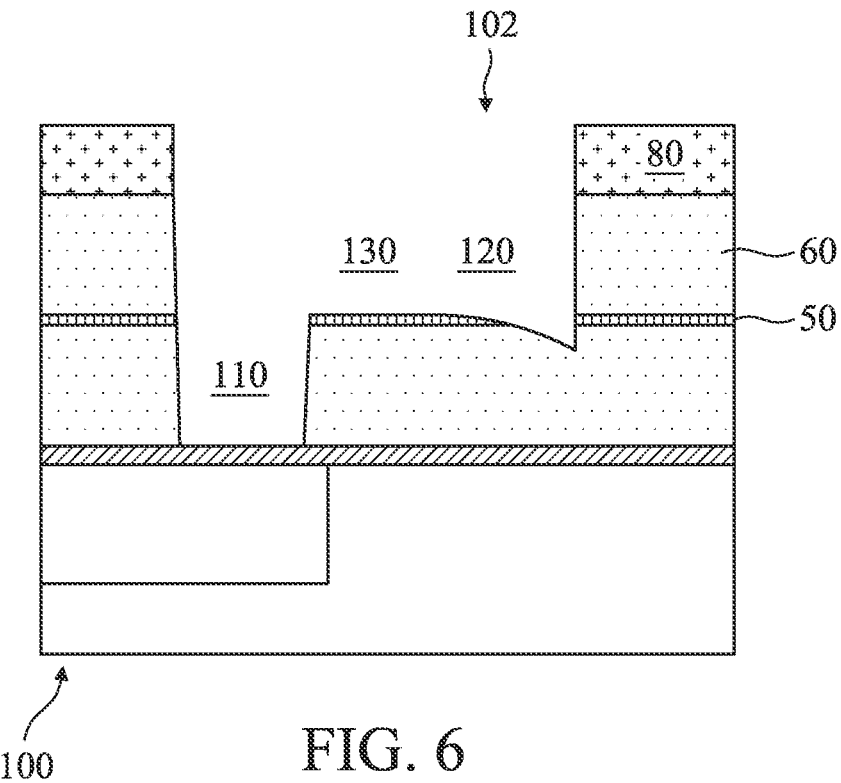

In FIG. 6, an etch process is performed to etch through the uncovered portion 102 of the third layer 60. The etch process may land on the etch stop layer 50 and on the etch stop layer 30 within the via 110. As a result, a trench 120 is formed and is in communication with the via 110. Collectively, this void may be referred to as a via-trench cavity 130.

Figure 7:
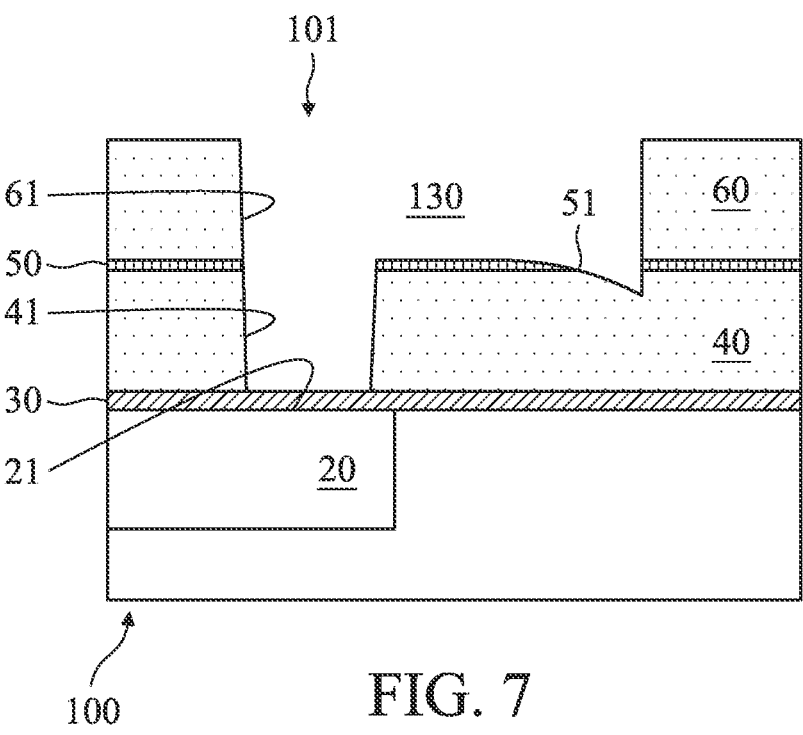

In FIG. 7, remaining portions of the mask 80 are removed. Further, the uncovered portion 101 of the etch stop layer 30 is removed to expose a portion of the conductive contact 20.

As shown in FIG. 7, the via-trench cavity 130 has a via bottom 21 formed by the conductive contact 20, via sidewalls 41 formed by the second layer 40, a trench bottom 51 which may be in part formed by the etch stop layer 50, and trench sidewalls 61 formed by the third layer 60. As described in more detail below in relation to FIGS. 21-28, the trench bottom 51 may be formed with a convex profile to facilitate conductive interconnect formation.

Figure 8:
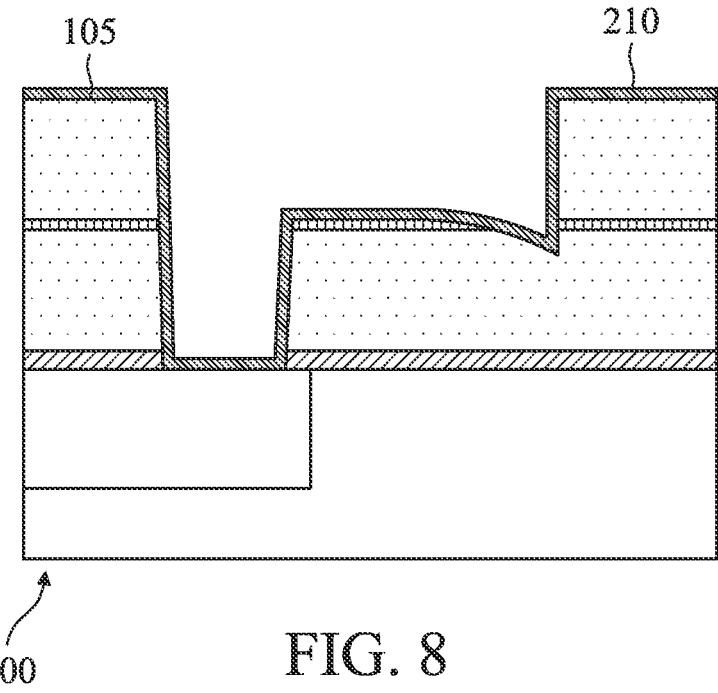
Figure 9:
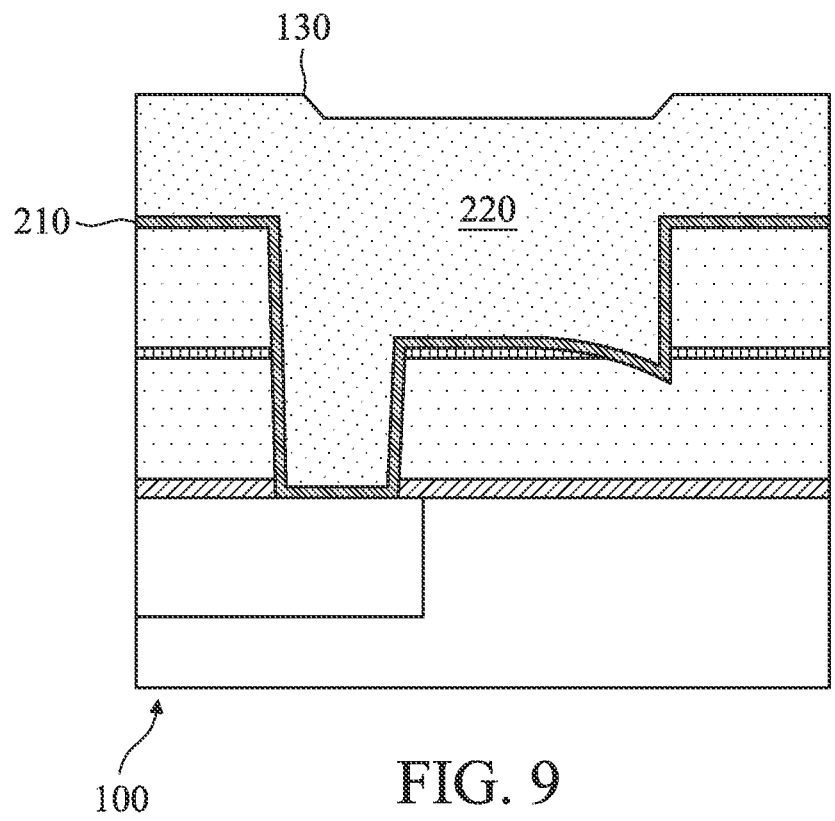
Figure 10:
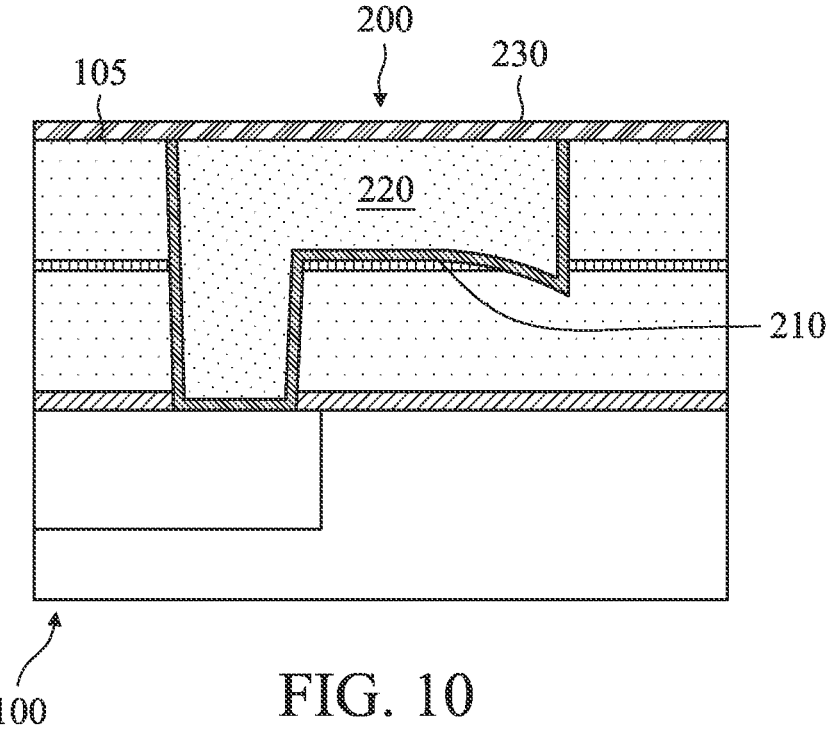

FIGS. 8-10 illustrate formation of a conductive interconnect 200 within the via-trench cavity 130.

As shown in FIG. 8, a barrier layer 210 is formed along the sidewalls and bottoms of the via-trench cavity 130 and over a top surface 105 of the structure 100.

In FIG. 9, a conductive material 220 is deposited over the barrier layer 210 and fills the remaining portion of the via-trench cavity 130.

In FIG. 10, a planarization process is performed to remove the portions of the barrier layer 210 and the conductive material 220 overlying the top surface 105 of the structure 100. As a result, the conductive interconnect 200 is completed. Further, an etch stop layer 230 is formed over the top surface 105 of the structure 100 for a next dual damascene process.

FIGS. 11-20 illustrate a trench-first damascene protocol.

Figure 11:
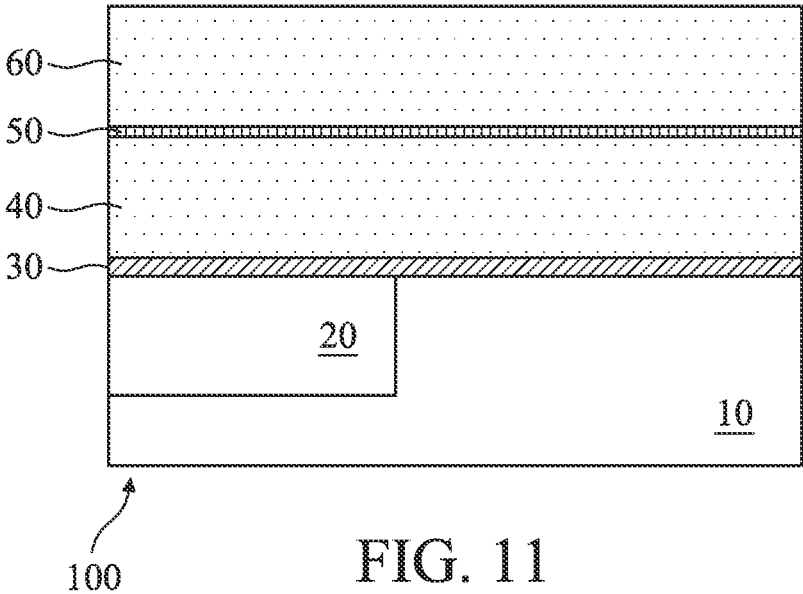
FIGS. 11-20 are cross-sectional schematic views of a portion of a semiconductor structure during sequential stages of a fabrication process for forming a via-trench cavity in accordance with some embodiments.

Referring to FIG. 11, an initial stage of processing of a semiconductor structure 100 is shown.

In FIG. 11, a first layer of dielectric material 10 is formed over a substrate (not shown). Further, a conductive contact 20 is formed within the first layer 10. An etch stop layer 30 may be formed over the first layer 10 and conductive contact 20. As shown, a second layer of dielectric material 40, such as an interlayer dielectric (ILD) is formed over the etch stop layer 30. Further, an optional etch stop layer 50 is formed over the second layer 40. As shown, a third layer of dielectric material 60, such as an intermetal dielectric (IMD) is formed over the etch stop layer 50.

Figure 12:
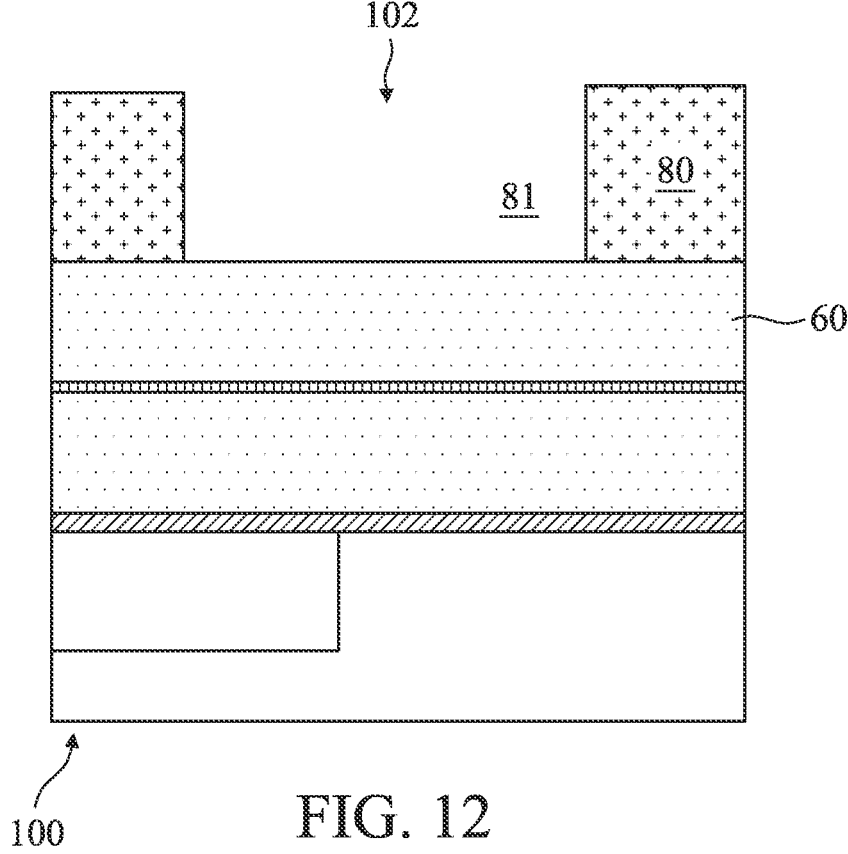

In FIG. 12, a trench formation process begins. In FIG. 12, a mask 80, such as photoresist, is formed over the third layer 60 and is patterned to form an opening 81 overlying an uncovered portion 102 of the structure 100.

Figure 13:
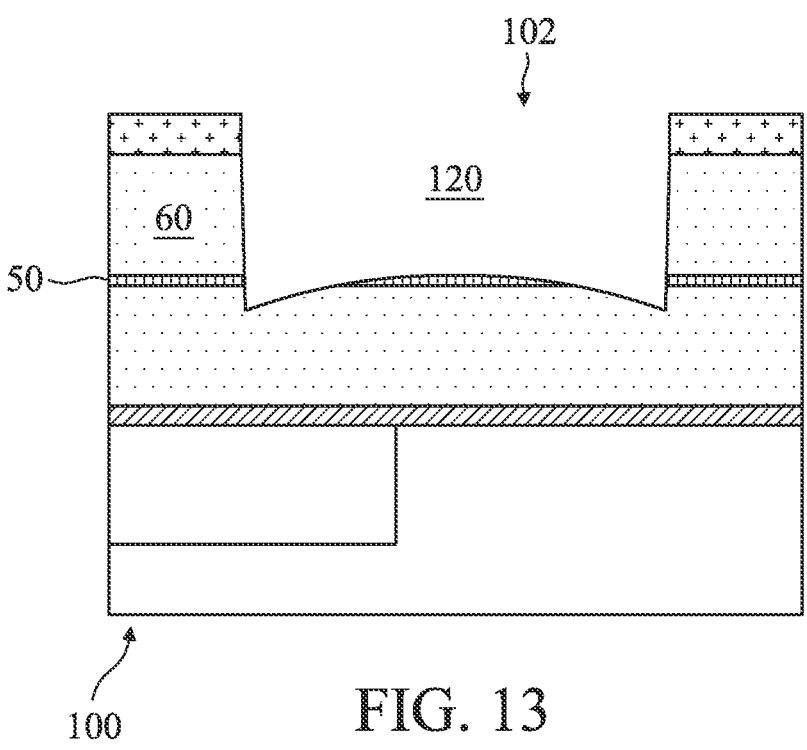

In FIG. 13, an etch process is performed to etch through the uncovered portion 102 of the third layer 60. The etch process may land on the etch stop layer 50. As a result, a trench 120 is formed.

Figure 14:
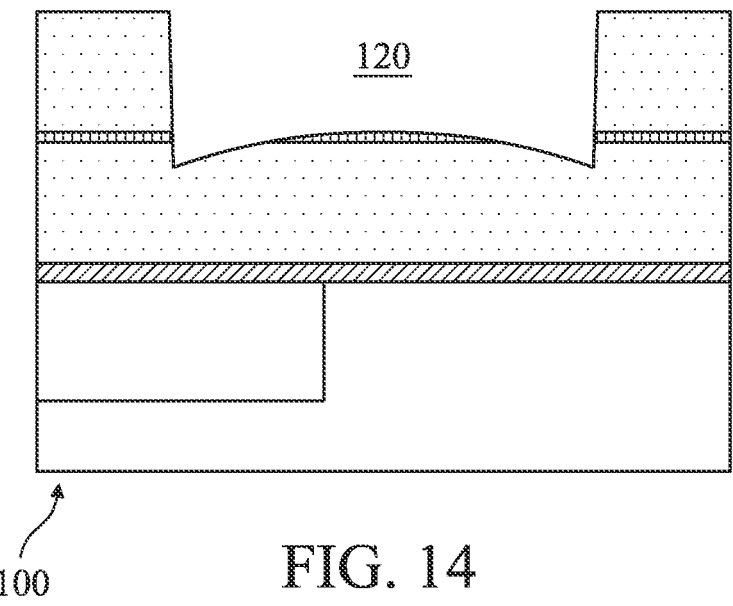

In FIG. 14, remaining portions of the mask 80 are removed.

Figure 15:
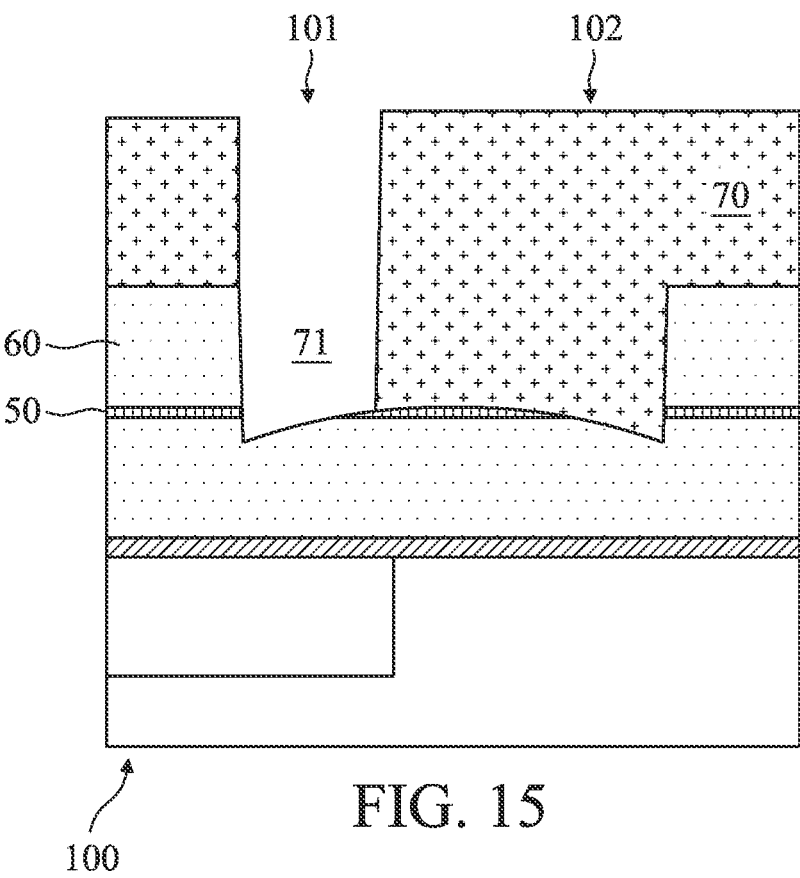

In FIG. 15, a via formation process begins. In FIG. 15, a mask 70, such as photoresist, is formed over the third layer 60 and over the etch stop layer 50 in the uncovered portion 102 and is patterned to form an opening 71 overlying an uncovered portion 101 of the structure 100. Further, the uncovered portion 101 of the etch stop layer 50 is removed.

Figure 16:
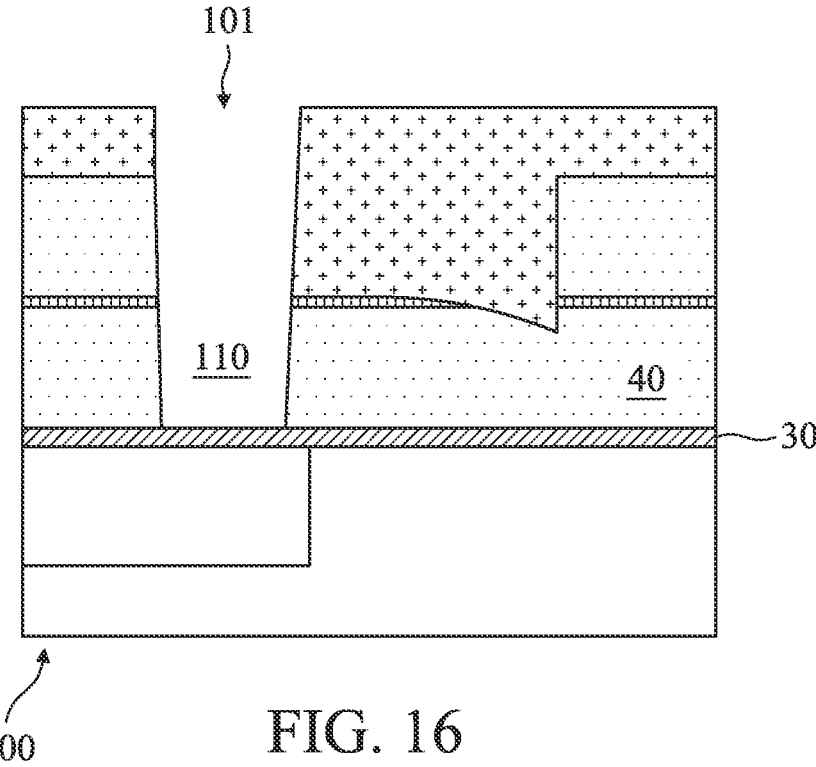

In FIG. 16, an etch process is performed to etch through the uncovered portions 101 of the second layer 40. The etch process may land on the etch stop layer 30. As a result, a via 110 is formed.

Figure 17:
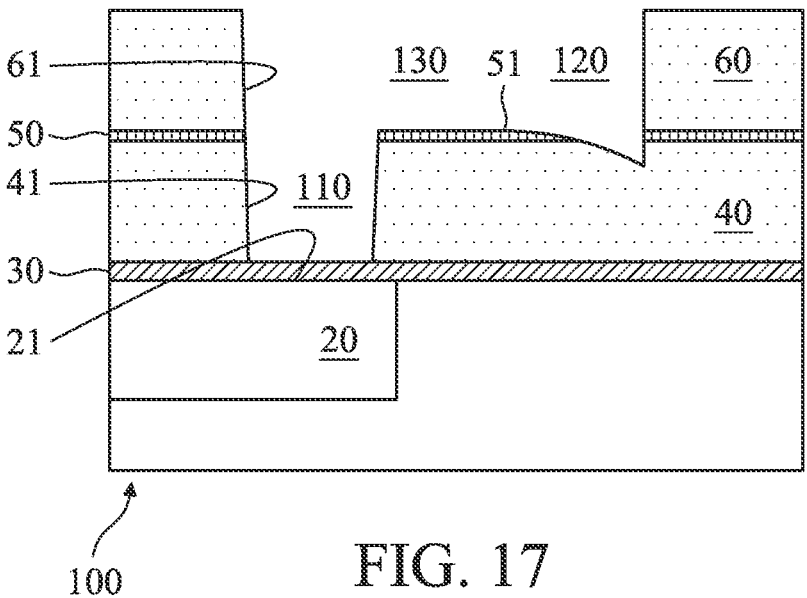

In FIG. 17, remaining portions of the mask 80 are removed. As shown, via 110 is in communication with the trench 120. Collectively, this void may be referred to as a via-trench cavity 130.

As shown in FIG. 17, the via-trench cavity 130 has a via bottom 21 formed by the conductive contact 20, via side-walls 41 formed by the second layer 40, a trench bottom 51 formed at least in part by the etch stop layer 50, and trench sidewalls 61 formed by the third layer 60. As described in more detail below in relation to FIGS. 21-28, the trench bottom 51 may be formed with a convex profile to facilitate conductive interconnect formation.

Figure 18:
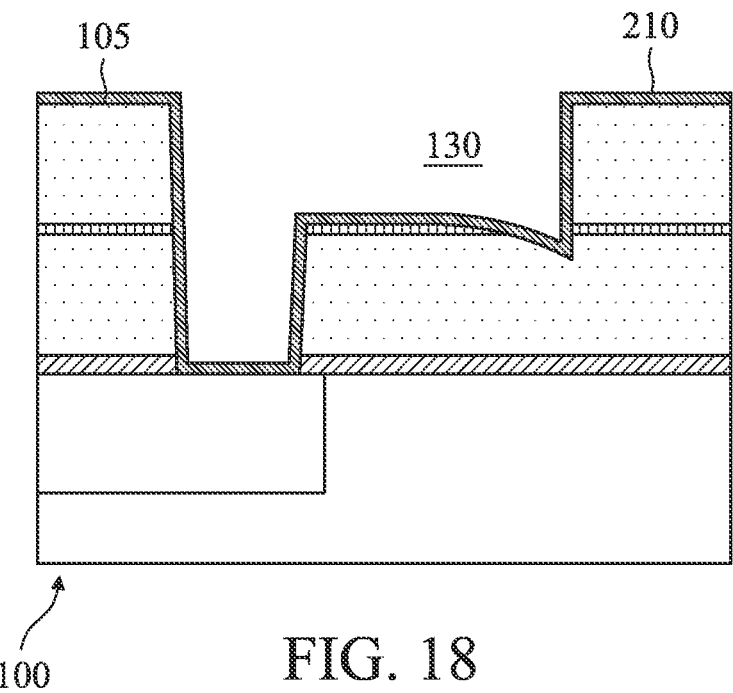
Figure 19:
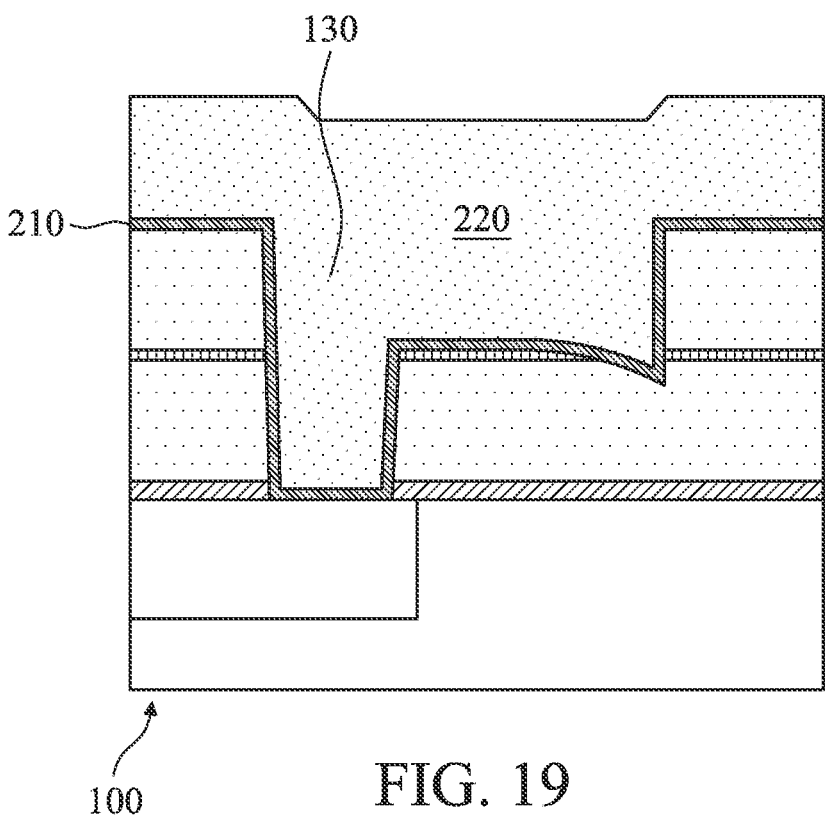
Figure 20:
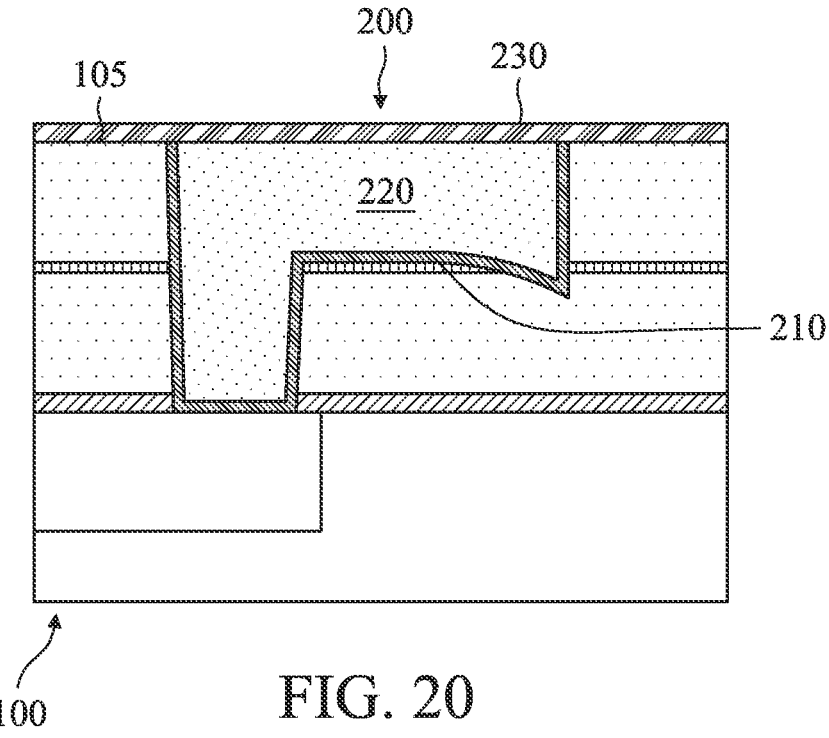

FIGS. 18-20 illustrate formation of a conductive interconnect 200 within the via-trench cavity 130.

As shown in FIG. 18, a barrier layer 210 is formed along the sidewalls and bottoms of the via-trench cavity 130 and over a top surface 105 of the structure 100.

In FIG. 19, a conductive material 220 is deposited over the barrier layer 210 and fills the remaining portion of the via-trench cavity 130.

In FIG. 20, a planarization process is performed to remove the portions of the barrier layer 210 and the conductive material 220 overlying the top surface 105 of the structure 100. As a result, the conductive interconnect 200 is completed. Further, an etch stop layer 230 is formed over the top surface 105 of the structure 100.

In the embodiments of FIGS. 1-10 and FIGS. 11-20, the components of the structure 100 may be the same. For example, an exemplary first layer 10, second layer 40, and third layer 60 may be independently selected from low k materials; an exemplary conductive contact 20 may be copper; and an exemplary etch stop layer 30 and etch stop layer 50 may be independently selected from low k materials with a different etch rates for a selected etchant as compared to etch rates of the adjacent dielectric layers; an exemplary barrier layer 210 may be physical vapor deposited tantalum nitride (PVD TaN); and an exemplary conductive material 220 may be copper formed by copper seed depositing (reflow) and copper electroplating.

Figure 21:
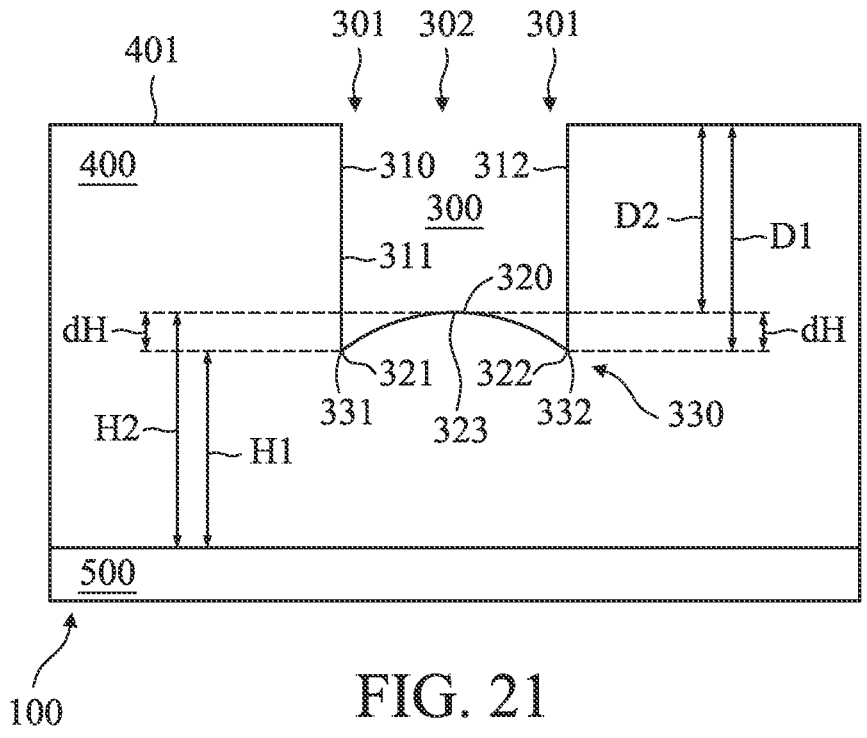
FIGS. 21 and 22 are cross-sectional schematic views of a trench cavity etched into a material in accordance with the processes of FIGS. 1-10 or FIGS. 11-20.

FIG. 21 illustrates the formation of a cavity 300, such as a trench cavity, in a semiconductor structure 100 according to embodiments herein. As shown, the structure 100 includes a dielectric layer 400 overlying a substrate 500.

The illustrated cavity 300 is formed in the dielectric layer 400 such that the dielectric layer 400 forms cavity sidewalls 310, including a first cavity sidewall 311 and an opposite second cavity sidewall 312, and forms a cavity bottom 320.

The cavity bottom 320 extends in a lateral x-direction from a first end 321 to a second end 322 and has a central portion 323 therebetween. In exemplary embodiments, the cavity bottom 320 has convex profile, i.e., the cavity bottom 320 rises in a vertical z-direction from the ends 321 and 322 to an apex at the central portion 323.

The cavity bottom 320 intersects the cavity sidewalls 310 at cavity corners 330, including a first cavity corner 331 and a second cavity corner 332. Specifically, the first end 321 of the cavity bottom 320 meets the first sidewall 311 at the first corner 331; and the second end 322 of the cavity bottom 320 meets the second sidewall 312 at the second corner 332.

As shown, the etch process etches the dielectric layer 400 to a maximum cavity depth D1 at a cavity periphery 301 along the cavity sidewalls 310 and etches the dielectric layer 400 to a minimum cavity depth D2 at a central portion 302. Each cavity depth D1 and D2 is measured from the top surface 401 of the dielectric layer 400. Thus, the end 321 of cavity bottom 320 and corner 331 and the end 322 of cavity bottom 320 and corner 332 are located at the maximum cavity depth D1 and the central portion 323 of cavity bottom 320 is located at the minimum cavity depth D2.

Alternatively, the location of the cavity bottom 320 may be considered in relation to the underlying substrate 500. For example, the end 321 of cavity bottom 320 and corner 331 and the end 322 of cavity bottom 320 and corner 332 are located at a minimum surface height H1 over the substrate 500 and the central portion 323 of cavity bottom 320 is located at a maximum surface height H2 over the substrate 500.

As may be seen, the cavity bottom 320 is formed with a height differential dH that is equal to the difference of surface heights H1 and H2, and is equal to the difference of cavity depths D1 and D2.

In exemplary embodiments the maximum cavity depth D1 is from 30 to 80 nanometers (nm). For example, the maximum cavity depth D1 may be at least 30 nm, such as at least 35 nm, for example at least 40 nm, such as at least 45 nm, or at least 50 nm. Further, the maximum cavity depth D1 may be at most 80 nm, such as at most 75 nm, for example at most 50 nm, for example at most 45 nm, such as at most 40 nm.

In exemplary embodiments, the height differential dH is from 0.5 to 3 nanometers (nm). For example, the height differential dH may be at least 0.5 nm, for example at least 1 nm, such as at least 1.5 nm, for example 2 nm, such as at least 2.5 nm, for example at least 3 nm. Further, the height differential dH may be at most 3 nm, for example at most 2.5 nm, such as at most 2 nm, for example at most 1.5 nm, such as at most 1 nm, for example at most 0.5 nm.

Figure 22:
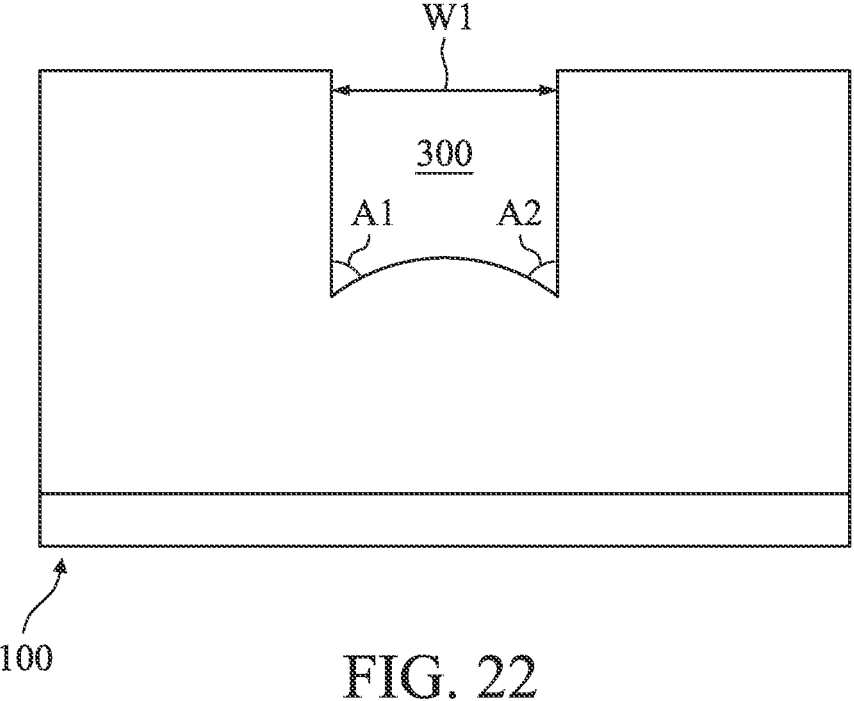

The structure 100 of FIG. 22 is identical to that of FIG. 21, and is provided for purposes of illustrative clarity. In FIG. 22, the cavity 300 is shown to have a critical dimension (CD) or width W1. In exemplary embodiments, the width W1 is from 10 to 200 nanometers (nm).

Cross-referencing FIGS. 21 and 22, cavity sidewall 311 intersects cavity bottom 320 at an angle A1 and cavity sidewall 312 intersects cavity bottom 320 at angle A2. In exemplary embodiments, each angle A1 and A2 is from 60 to 90 degrees. Further, in exemplary embodiments, a difference or delta in angles A1 and A2 is less than 2 degrees, such as less than 1 degree. For example, a delta range of the angles A1 and A2 is from 1 to 2 degrees.

In exemplary embodiments, each angle A1 and A2 is acute, i.e., less than 90 degrees. For example, exemplary angles A1 and A2 are less than 85 degrees, such as less than 80 degrees, for example less than 75 degrees, such as less than 70 degrees, for example less than 65 degrees. Further, in exemplary embodiments, each angle A1 and A2 is greater than 60 degrees, such as greater than 65 degrees, for example greater than 70 degrees, such as greater than 75 degrees, for example greater than 80 degrees, such as greater than 85 degrees.

It is noted that FIGS. 21 and 22 illustrate a single dielectric layer 400. It is contemplated that the dielectric layer 400 may include dielectric sublayers or may be formed from different dielectric material layers, such as from ILD, IMD, and/or etch stop layers. In certain embodiments, the cavity bottom 320 is formed by a single material or sublayer. In other embodiments, the cavity bottom 320 is formed by more than one material or sublayer of dielectric layer 400.

Further, it is noted that no structure or sublayer within layer 400 is formed with the convex cavity bottom surface 320 before the etching process begins. In other words, the etching process does not land on a structure defined with the cavity bottom surface 320. Rather, the etching process etches the ends 321 and 322 at a faster rate than the process etches the central portion 323. Thus, the convex profile of the cavity bottom surface 320 results from the etch process that forms the cavity 300, not from an earlier-performed fabrication or etching process. Further, if the etching process for forming cavity 300 were continued, additional dielectric material at the cavity bottom surface 320 would be etched.

In order to form the cavity 300 over a convex cavity bottom 320, a plasma etching process may be used. It is believed that, during the plasma etching process, ions reflect from cavity sidewalls on incidence, and re-impinge on the cavity bottom surface adjacent to the sidewalls, causing micro-trenching near the sidewalls and formation of the convex bottom surface. Further, it is believed that the micro-trenching phenomenon increases with an increase in RF bias power, such as to an RF bias power of from 10 to 500 watts. Also, it is believed that the micro-trenching phenomenon increases with an increase in ionization energy, such as to an ionization energy of from 10 to 500 electron-volts (eV). Moreover, it is believed that the micro-trenching phenomenon increases with use of a relatively heavier dilution gas, such as argon (Ar), to increase the bombardment effect to increase etching of the cavity bottom adjacent to the cavity sidewalls.

In exemplary embodiments, the etching process may be performed with an inductively coupled plasma (ICP) or a capacitively couple plasma (CCP) etching tool. In exemplary embodiments, the etching process may be performed at a pressure of from 3 to 150 milliTorr (mTorr). In exemplary embodiments, the etching process may be performed at a temperature of from −80 to 140° C. In exemplary embodiments, the etching process may be performed with a RF bias power of greater than 30 watts. In exemplary embodiments, the etching process may be performed with argon (Ar) dilution gas.

With the formation of the cavity 300 as shown in FIGS. 21-22, an exemplary method may continue with the formation of a barrier layer.

Figure 23:
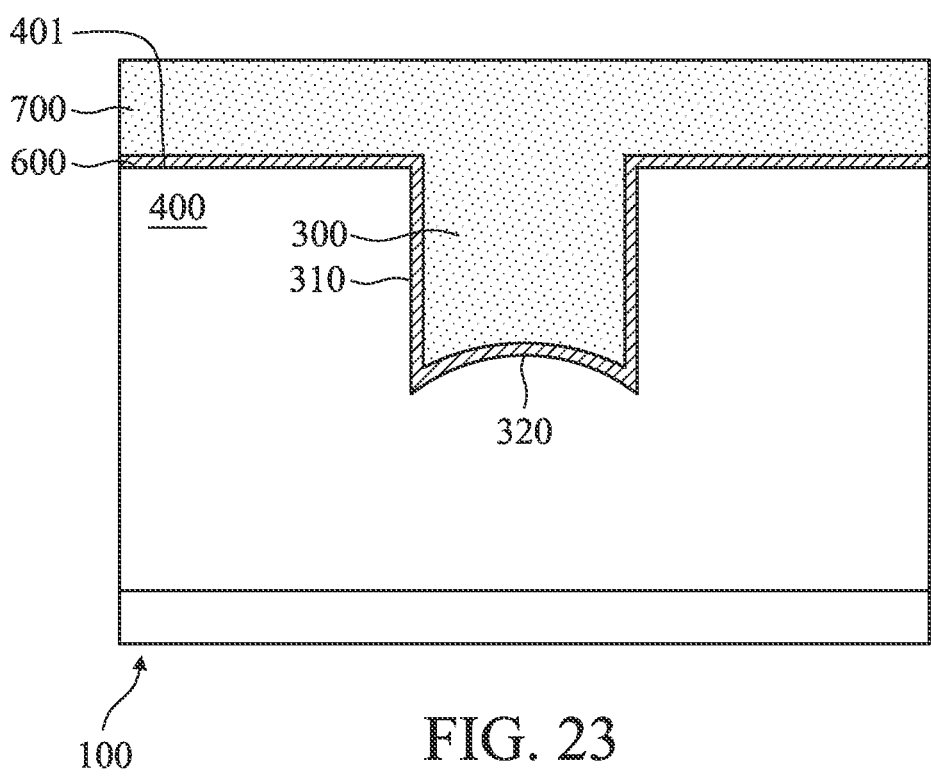
FIGS. 23 and 24 are cross-sectional schematic views of further processing of the trench cavity of FIGS. 21 and 22 in accordance with some embodiments.

As shown in FIG. 23, a continuous barrier layer 600 is formed along the cavity sidewalls 310 and cavity bottom 320 and over the top surface 401 of layer 400. For example, a barrier layer 600 of tantalum nitride (TaN) may be conformally deposited by physical vapor deposition (PVD).

As further shown in FIG. 23, a conductive material 700 may be deposited over the barrier layer 600 and may fill cavity 300. In exemplary embodiments, the conductive material 700 is a metal, such as copper. Further, in exemplary embodiments, the conductive material 700 is deposited as a seed layer followed by an electroplating process.

Figure 24:
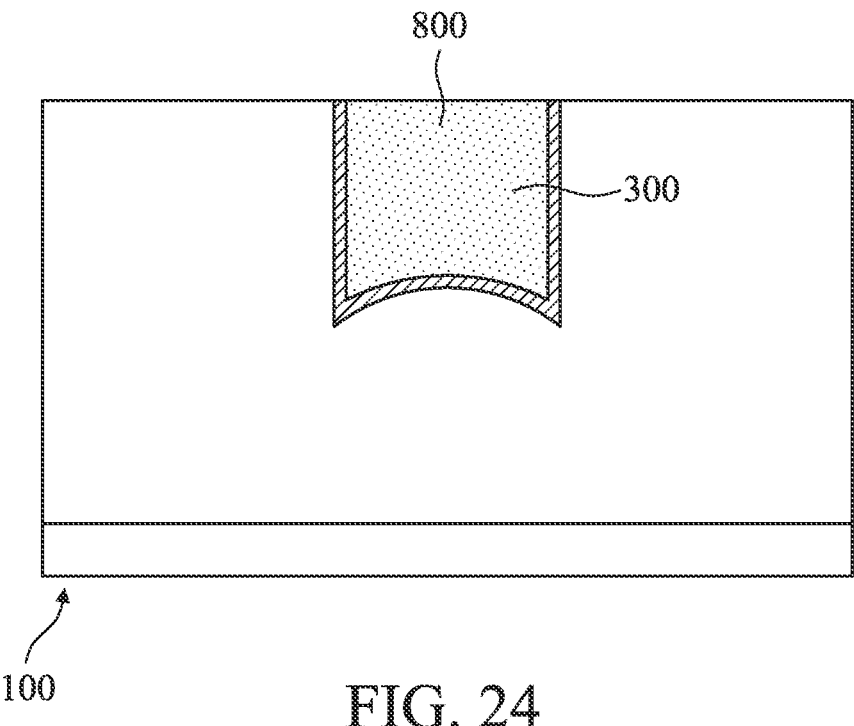

In FIG. 24, a planarization process is performed to remove the portions of the barrier layer 600 and conductive material 700 lying over the top surface 401. As a result, conductive interconnect 800 is formed within cavity 300. An exemplary conductive interconnect 800 is a metal line. FIGS. 23-24 show a location which does not include a via, and the metal fill is formed after via patterning in other locations. Thus, FIG. 24 illustrates a location at a same stage as FIG. 26, but at a via-less location. FIGS. 23-24 illustrate a trench-first process.

Figure 25:
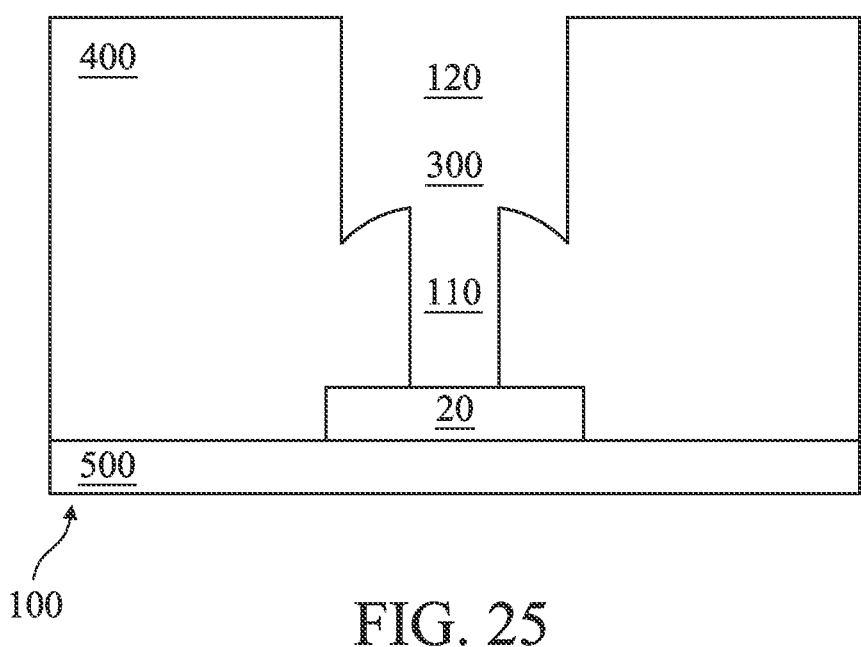
FIGS. 25-26 are cross-sectional schematic views of processing of a via-trench cavity in accordance with the processes of FIGS. 1-10 or FIGS. 11-20.
Figure 26:
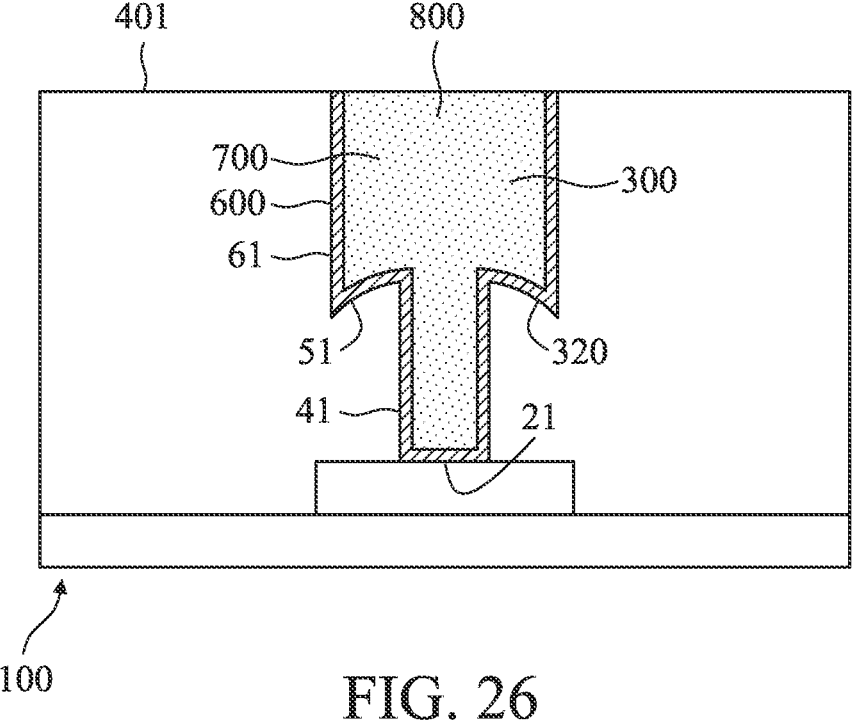

FIGS. 25-26 illustrate the formation of a conductive interconnect 800 within a via-trench cavity 300. In FIG. 25, a trench 120 is formed in dielectric layer 400 over substrate 500. The trench 120 may be formed similarly to the process described in relation to FIGS. 21 and 22. Further, as shown, a via 110 is formed in dielectric layer 400. The via 110 may be formed similarly to the process described in relation to FIG. 2-3 or 15-16, i.e., in a via-first or trench-first process. As shown, the via 110 lands on a conductive contact 20.

As shown in FIG. 26, a continuous barrier layer 600 is formed along the trench sidewalls 61 and trench bottom 51, along via sidewalls 41, and along via bottom 21. As further shown in FIG. 26, a conductive material 700 is deposited over the barrier layer 600 and fills cavity 300. Further, in FIG. 26, a planarization process is performed to remove the portions of the barrier layer 600 and conductive material 700 lying over the top surface 401. As a result, conductive interconnect 800 is formed within via-trench cavity 300.

Figure 27:
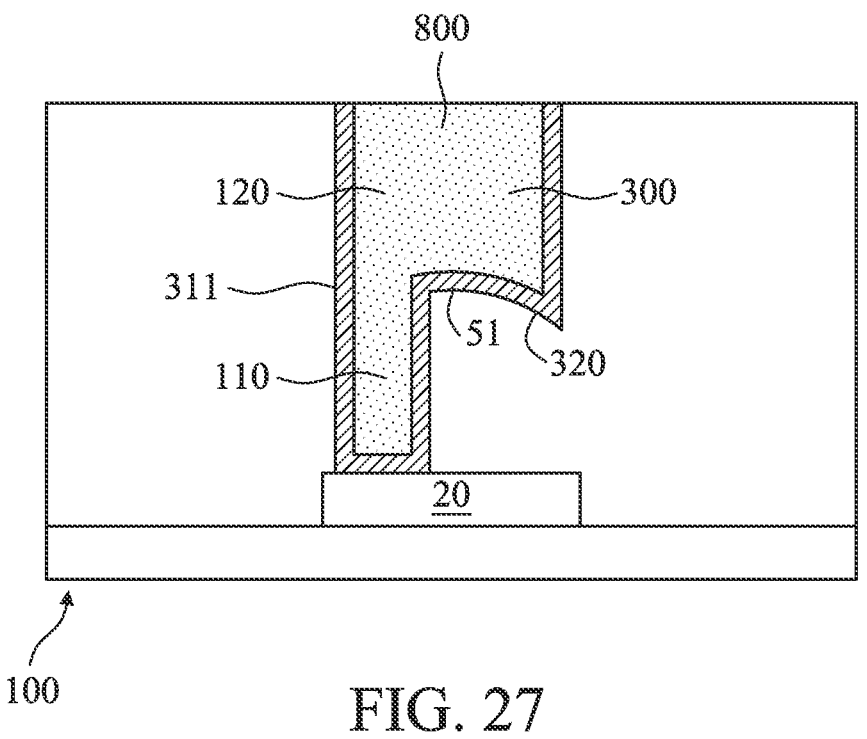
FIG. 27 is a cross-sectional schematic view of another embodiment of a via-trench cavity in accordance with some embodiments.

FIG. 27 illustrates an alternative embodiment of a conductive interconnect 800 formed in a via-trench cavity 300. In FIG. 27, the via 110 is aligned with the trench 120 along sidewall 311. Such a structure may be formed using the same processing as described above along with alignment of masks and etching processes.

Cross-referencing FIGS. 26 and 27 with FIGS. 21-22, it may be seen that trench bottom 51 of FIGS. 26 and 27 may be considered to be cavity bottom 320 of FIGS. 21-22 and is provided with the described respective depths D1 and D2, heights H1 and H2, width W1, and angles A1 and A2 (or just angle A2 in the embodiment of FIG. 27). In other words, the additional processing of etching a via to form the cavity as a via-trench cavity does not change the benefit of forming the cavity bottom with a convex profile to improve barrier layer formation thereon.

Figure 28:
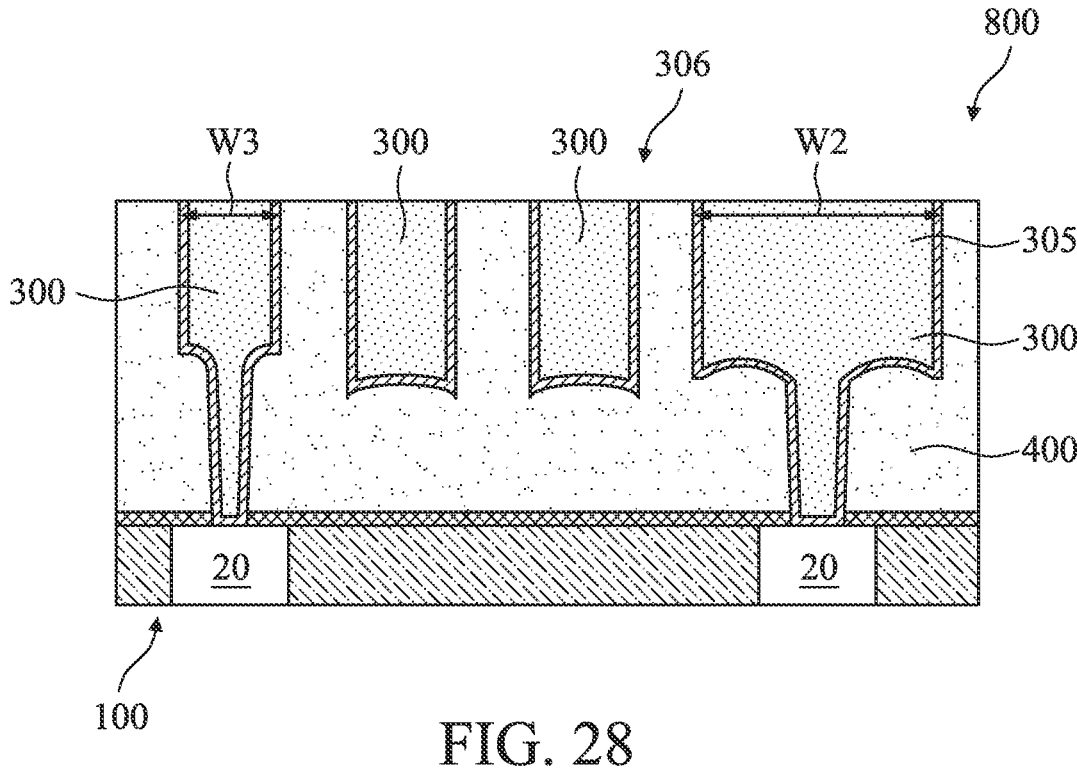
FIG. 28 is a cross-sectional schematic view of a plurality of conductive interconnects formed in trench and via-trench cavities in a dielectric layer in accordance with some embodiments.

FIG. 28 illustrates the formation of multiple conductive interconnects 800 in multiple cavities 300, including trench cavities and via-trench cavities, in a dielectric layer 400 according to exemplary embodiments. As shown, the cavities 300 (and conductive interconnects 800 formed therein) may be formed with different critical dimensions or widths. For example, large cavity 305 may be formed with a width W2 and small cavities 306 may be formed with a width W3 that is less than width W2. Each width W2 and W3 may be from 10 to 200 nanometers (nm). The ratio of width of a large cavity to a small cavity formed in a dielectric layer 400 during the processing described herein may be equal to or less than 20:1, 15:1, 12:1, 10:1, 8:1, 6:1, 5:1, 2:1, or 1.5:1. The ratio of width of a large cavity to a small cavity formed in a dielectric layer 400 during the processing described herein may be equal to or greater than 1.5:1, 2:1, 5:1, 6:1, 8:1, 10:1, 12:1, or 15:1.

As noted above in relation to FIG. 22, each cavity may be formed with corners having angles A1 and A2. Cross-referencing FIGS. 22 and 28, it is noted that angles A1 and A2 within a large-width cavity, such as cavity 305, may be greater than angles A1 and A2 within a small-width cavity. For example, the difference between the delta range of angles in a large-width cavity and the delta range of angles in a small-width cavity may be less than about 5 degrees.

It is noted that for trench cavities, such as those illustrated in FIGS. 21-24, the cavity bottom having the convex profile forms the lowest depth of the trench cavity and of the conductive interconnect formed within the cavity. Further, it is noted that for via-trench cavities, such as those illustrated in FIGS. 25-27, the cavity bottom having the convex profile does not form the lowest depth of the joined via-trench cavity or of the conductive interconnect formed therein. Rather, in such embodiments the via extends downward from the convex trench bottom into contact with the underlying conductive structure. Claims herein cover both embodiments of trench bottoms having convex profiles, whether or not a via extends downward from a portion of the convex trench bottom. Thus, a cavity bottom may be located at the ultimate bottom of a trench cavity or at a mid-height position on a via-trench cavity which includes a deeper via bottom.

A method for fabricating a semiconductor structure is described herein in relation to formation of a conductive interconnect in a cavity over a convex bottom. Further processing may include formation of additional dielectric and metal layers, passivation, and packaging, or other back-end-of-line (BEOL) processing. The convex trench profile can be during a single damascene process (e.g. metal-0) or during a dual damascene process (e.g., metal-1 to top metal).

A method is described herein and includes providing a substrate having a conductive feature in a first dielectric layer; depositing a second dielectric layer over the conductive feature and the first dielectric layer; etching the second dielectric layer to form a cavity through the second dielectric layer, wherein the cavity has a bottom with a convex profile; depositing a barrier layer along the bottom of the cavity; and depositing a conductive material in the cavity to form a structure electrically connected to the conductive feature.

In certain embodiments, the method further includes forming a via on the conductive feature.

In certain embodiments of the method, the bottom of the cavity is formed by the dielectric layer.

In certain embodiments of the method, etching the second dielectric layer to form the cavity through the second dielectric layer comprises forming the cavity with a sidewall intersecting the bottom at an angle of from 60° to 90°.

In certain embodiments of the method, etching the second dielectric layer to form the cavity through the second dielectric layer includes forming the cavity with a first sidewall intersecting a first end of the bottom at a first angle and with a second sidewall intersecting a second end of the bottom at a second angle; and a difference between the first angle and the second angle is no more than 2°.

In certain embodiments of the method, etching the second dielectric layer to form the cavity through the second dielectric layer includes forming the cavity with a depth from about 30 nm to about 80 nm.

In certain embodiments of the method, depositing the barrier layer along the bottom of the cavity includes depositing the barrier layer along a sidewall of the cavity, resulting in a lined cavity. In such embodiments, depositing the conductive material in the cavity may include filling the lined cavity with a metal material.

In certain embodiments of the method, etching the second dielectric layer to form the cavity through the second dielectric layer includes etching the dielectric layer to form a trench and etching the dielectric layer to form a via, wherein the cavity is a via-trench cavity and, after etching the dielectric layer to form the trench and after etching the dielectric layer to form the via, the via extends from the bottom of the trench through the dielectric layer to a metal contact. In such embodiments, depositing the barrier layer along the bottom of the cavity includes forming the barrier layer overlying an exposed surface of the via-trench cavity, resulting in a lined via-trench cavity. Further, in such embodiments, depositing the conductive material in the trench cavity may include filling the lined cavity with a metal material.

A method is described herein and includes performing an etching process to etch a material to form a trench bound by a trench sidewall formed from the material and a trench bottom formed from the material; wherein the material has an upper surface; wherein the trench sidewall extends downward from the upper surface and intersects the trench bottom at a trench corner at a first depth below the upper surface; wherein the trench bottom has a central portion at a second depth from the upper surface; and wherein the second depth is less than the first depth.

In certain embodiments of the method, the trench sidewall and the trench bottom form an angle of from 60° to 90° at the trench corner, and the second depth is at least 0.5 nanometers (nm) less than the first depth.

In certain embodiments of the method, the etching process comprises a plasma etching process.

In certain embodiments, the method further includes forming a conductive structure in the trench, wherein the conductive structure has a side surface in contact with the trench sidewall and has a bottom surface in contact with the trench bottom.

A semiconductor structure is provided herein and includes a dielectric material over a substrate and a conductive structure located in the dielectric material, wherein the conductive structure has a bottom surface and a side surface that join at a corner at a first height over the substrate, wherein the bottom surface includes a central portion at a second height over the substrate greater than the first height.

In certain embodiments of the semiconductor structure, the second height is at least 0.5 nanometers (nm) greater than the first height.

In certain embodiments of the semiconductor structure, the bottom surface and the side surface intersect at an angle of from 60° to 90° at the corner.

In certain embodiments of the semiconductor structure, the bottom surface and the side surface directly contact the dielectric material.

In certain embodiments of the semiconductor structure, the conductive structure includes a barrier layer in direct contact with the dielectric material, and a metal overlying the barrier layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present.

What is claimed is:

1. A method comprising:

performing an etching process to etch a material to form a trench bound by a trench sidewall formed from the material and a convex trench bottom surface formed from the material, wherein the material has an upper surface, wherein the trench sidewall extends downward from the upper surface and intersects the convex trench bottom surface at a trench corner at a first depth below the upper surface;

etching the material through a portion of the convex trench bottom surface to form a via bound by a via sidewall;

depositing a barrier layer along the trench sidewall, along remaining portions of the convex trench bottom surface, and along the via sidewall, wherein a convex profile of the convex trench bottom surface is configured to facilitate formation of the barrier layer as a continuous barrier layer without voids or disconnections at the trench corner; and forming a conductive structure over the barrier layer in the trench and the via.

2. The method of claim 1, wherein the trench sidewall and the convex trench bottom surface form an angle of at least 60° at the trench corner.

3. The method of claim 1, wherein the etching process comprises a plasma etching process performed with an RF bias power of from 10 to 500 watts, with an ionization energy of from 10 to 500 electronvolts (eV), and with a dilution gas comprising argon (Ar) such that ions reflect from the trench sidewall on incidence and re-impinge on the material adjacent to the trench sidewall to form the convex trench bottom surface.

4. The method of claim 1, wherein the convex trench bottom surface is formed only from the material.

5. The method of claim 1, wherein the etching process comprises plasma etching using an inductively coupled plasma (ICP) or capacitively coupled plasma (CCP) etching tool at a pressure of from 3 to 150 milliTorr and with argon dilution gas.

6. The method of claim 1, wherein:

no structure or sublayer within the material is formed with the convex trench bottom surface before the etching process begins; and the etching process etches ends of the convex trench bottom surface at a faster rate than the etching process etches a central portion of the convex trench bottom surface to form the convex profile.

7. A method comprising:

providing a substrate having a dielectric layer; and performing an etching process to etch the dielectric layer to form a cavity with a sidewall and having a bottom with a convex profile, wherein the etching process comprises a plasma etching process performed with a pressure of from 3 to 150 milliTorr (mTorr), a temperature of from −80 to 140° C., and a RF bias power of greater than 30 watts that causes ions to reflect from the sidewall and re-impinge on the dielectric layer adjacent to the sidewall to form micro-trenching, and wherein the convex profile of the bottom results from the micro-trenching.

8. The method of claim 7, wherein the bottom of the cavity is formed by the dielectric layer.

9. The method of claim 7, wherein the cavity has a critical dimension (CD) of from about 10 nm to about 200 nm.

10. The method of claim 7, wherein performing the etching process comprises forming the cavity with the sidewall intersecting the bottom at an angle of at least 60°.

11. The method of claim 7, wherein performing the etching process comprises forming the cavity with a first sidewall intersecting a first end of the bottom at a first internal angle and with a second sidewall intersecting a second end of the bottom at a second internal angle; and wherein a difference between the first internal angle and the second internal angle is no more than 2°.

12. The method of claim 7, wherein etching performing the etching process comprises forming the cavity with a depth from about 30 nm to about 50 nm.

13. The method of claim 7, further comprising forming a barrier layer overlying an exposed surface of the cavity, resulting in a lined cavity.

14. The method of claim 13, further comprising filling the lined cavity with a metal material.

15. The method of claim 7, wherein performing the etching process comprises etching the dielectric layer to form a trench and etching the dielectric layer to form a via, wherein the cavity is a via-trench cavity and wherein, after etching the dielectric layer to form the trench and after etching the dielectric layer to form the via, the via extends from the bottom of the trench through the dielectric layer to a metal contact.

16. The method of claim 15, further comprising:

forming a barrier layer overlying an exposed surface of the via-trench cavity, resulting in a lined via-trench cavity; and filling the lined via-trench cavity with a metal material.

17. A method comprising:

performing an etching process to etch a material to form a first trench bound by a first trench sidewall formed from the material and a first convex trench bottom surface formed from the material and to form a second trench bound by a second trench sidewall formed from the material and a second convex trench bottom surface formed from the material, wherein the first trench has a first width and the second trench has a second width, wherein a ratio of the first width to the second width is from 1.5:1 to 20:1.

18. The method of claim 17, wherein the etching process is a plasma etching process performed with an RF bias power of from 10 to 500 watts and an ionization energy of from 10 to 500 electronvolts (eV) such that ions reflect from the respective trench sidewalls on incidence and re-impinge on the material adjacent to the respective sidewalls to form the respective convex trench bottom surfaces.

19. The method of claim 18, wherein the plasma etching process is performed with a dilution gas comprising argon (Ar).

20. The method of claim 19, wherein the plasma etching process is performed with an inductively coupled plasma (ICP) or a capacitively couple plasma (CCP) etching tool with a pressure of from 3 to 150 milliTorr (mTorr), a temperature of from −80 to 140° C., and a RF bias power of greater than 30 watts.

* * * * *